United States Patent
Kwak

(10) Patent No.: US 8,564,947 B2
(45) Date of Patent: Oct. 22, 2013

(54) HEAT EXHAUSTION STRUCTURE FOR HEAT DISSIPATING DEVICE

(75) Inventor: Chang Soo Kwak, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 362 days.

(21) Appl. No.: 13/025,533

(22) Filed: Feb. 11, 2011

(65) Prior Publication Data

US 2011/0198058 A1  Aug. 18, 2011

(30) Foreign Application Priority Data

Feb. 12, 2010 (KR) .................. 10-2010-0013297
Sep. 10, 2010 (KR) .................. 10-2010-0088728

(51) Int. Cl.
  *H05K 7/20*   (2006.01)
  *H01L 23/34*  (2006.01)
  *G06F 1/20*   (2006.01)

(52) U.S. Cl.
  USPC ............. 361/679.41; 361/679.52; 361/688; 257/713

(58) Field of Classification Search
  USPC ............. 361/679.47, 679.52, 688; 257/713
  See application file for complete search history.

(56) References Cited

U.S. PATENT DOCUMENTS

| | | | | |
|---|---|---|---|---|
| 4,015,585 A * | 4/1977 | Fattor | ............. | 126/578 |
| 4,154,152 A * | 5/1979 | Lang-Ree et al. | ............. | 99/386 |
| 4,346,324 A * | 8/1982 | Yoldas | ............. | 313/112 |
| 4,366,407 A * | 12/1982 | Walsh | ............. | 313/112 |
| 4,409,512 A * | 10/1983 | Walsh | ............. | 313/113 |
| 4,415,234 A * | 11/1983 | Meyers | ............. | 359/848 |
| 4,581,689 A * | 4/1986 | Oram | ............. | 362/275 |
| 4,841,422 A * | 6/1989 | Groh | ............. | 362/294 |
| 4,885,668 A * | 12/1989 | Maglica et al. | ............. | 362/345 |
| 5,285,363 A * | 2/1994 | Meuse | ............. | 362/293 |
| 5,509,733 A * | 4/1996 | Danley | ............. | 374/11 |
| 5,548,182 A * | 8/1996 | Bunk et al. | ............. | 313/113 |
| 5,913,552 A * | 6/1999 | McLellan et al. | ............. | 29/843 |
| 6,417,576 B1 * | 7/2002 | Ellenberger et al. | ............. | 257/787 |
| 7,429,792 B2 | 9/2008 | Lee et al. | | |
| 2004/0051984 A1* | 3/2004 | Oshino et al. | ............. | 359/845 |
| 2005/0024834 A1 | 2/2005 | Newby | | |
| 2005/0213050 A1* | 9/2005 | Suzuki | ............. | 353/58 |

FOREIGN PATENT DOCUMENTS

JP   2007-500448    1/2007
KR   1020080044490  5/2008

* cited by examiner

*Primary Examiner* — Evan Pert
(74) *Attorney, Agent, or Firm* — Nelson Mullins Riley & Scarborough LLP

(57) ABSTRACT

A heat exhaustion structure for a heat dissipating device is provided. The present invention relates to a heat exhaustion structure for a heat dissipating device, and more particularly, to a heat exhaustion structure that may effectively exhaust an internal heat generated by heat dissipating devices included in a semiconductor package and in a large number of electronic products.

4 Claims, 5 Drawing Sheets

HEAT EXHAUSTION STRUCTURE FOR HEAT DISSIPATING DEVICE

CROSS-REFERENCE TO RELATED APPLICATIONS

This application claims the benefit of Korean Patent Application No. 10-2010-0013297 and of Korean Patent Application No. 10-2010-0088728, respectively filed on Feb. 12, 2010 and Sep. 10, 2010, in the Korean Intellectual Property Office, the disclosures of which are incorporated herein by reference.

BACKGROUND

1. Field of the Invention

The present invention relates to a heat exhaustion structure for a heat dissipating device, and more particularly, to a heat exhaustion structure that may effectively exhaust an internal heat generated by heat dissipating devices included in a semiconductor package and in a large number of electronic products.

2. Description of the Related Art

Generally, a heat generated in an electronic device is exhausted to the outside, by using forced or natural convection and using conduction. In particular, in an example in which a inlet port and an exhaust port are included in an electronic device, a scheme of drawing in an external air through the inlet port, cooling an internally generated heat using the drawn-in external air, and exhausting the heat to the outside through the exhaust port may be effective for heat exhaustion.

The scheme may be applied to an electronic device, such as a personal computer (PC), of which the environment and the side of the PC need not to be separated completely. However, it is difficult to apply the scheme to an electronic device, such as a high-frequency high-power amplifier, of which the environment and the side of the PC need to be separated completely.

Accordingly, in the latter case, it is desirable to transfer an internally generated heat to the outside through internal conduction via a case, and then through forced or natural convection using an air flow passing through an outer wall of the case.

FIG. 1 is a diagram illustrating a conventional heat exhaustion structure.

Referring to FIG. 1, a portion of a heat generated by a heat dissipating device 100 may be conducted by a substrate 101 where the heat dissipating device 100 is installed. The conducted heat may be transferred to a heat sink 103 through a case 102, and may be exhausted to the outside. Another portion of the heat may be transferred to the case 102 through radiation, and then be conducted to the heat sink 103.

Here, when a plurality of substrates 101 are piled up as shown in FIG. 1, a heat generated by a heat dissipating device 100 on a substrate 101 may be transferred to an upper substrate 101 through radiation.

For example, when a heat dissipating device for generating a great amount of heat is installed on a lower substrate, a temperature of an upper substrate may be further increased compared to other substrates. Additionally, since the substrates 101 have low thermal conductivity due to their characteristics, a scheme of further improving a heat exhaustion scheme through the radiation may be efficient in view of system heat management.

FIG. 2 is a diagram illustrating another conventional heat exhaustion structure.

Referring to FIG. 2, a block A made of metal materials with high thermal conductivity is disposed between a heat dissipating device 110 and a case 111, and accordingly an efficiency of heat exhaustion through the conduction may be increased.

However, in an example in which a height of the block A is greater than a distance between the heat dissipating device 110 and the case 111, the heat dissipating device 110 may be damaged due to a pressure applied to the case 111 and the block A. Conversely, in another example in which the height of the block A is less than the distance, both ends of the block A may not be sufficiently in contact with each other, an efficiency of heat transfer through the block A may be reduced. Additionally, in both the examples, processing may be performed so that a manufacturing tolerance may be reduced, however, problems occur that a gap may be formed due to an actual size by an assembling tolerance.

SUMMARY

An aspect of the present invention provides a heat exhaustion structure for a heat dissipating device that may transfer a heat radiated from the heat dissipating device concentratively to a heat sink or a case using an optical component such as an infrared lens and/or an infrared reflecting mirror.

Another aspect of the present invention provides a heat exhaustion structure for a heat dissipating device that may more accurately transfer a heat radiated from the heat dissipating device to a predetermined portion of a heat sink or a predetermined portion of a case, by adjusting an angle of an optical component.

According to an aspect of the present invention, there is provided a heat exhaustion structure for a heat dissipating device, including: a substrate where the heat dissipating device is installed; a case to transfer a heat generated by the heat dissipating device to a heat sink or to an outside, the case being installed in a side of the substrate; and an infrared lens to deflect the heat to the heat sink or to the case.

According to another aspect of the present invention, there is provided a heat exhaustion structure for a heat dissipating device, including: a substrate where the heat dissipating device is installed; a case to transfer a heat generated by the heat dissipating device to a heat sink or to an outside, the case being installed in a side of the substrate; and an infrared reflecting mirror to reflect the heat to the heat sink or to the case.

EFFECT

According to embodiments of the present invention, a heat generated by a heat dissipating device may be transferred to a heat sink or a case by concentrating or reflecting the heat, and thus it is possible to effectively exhaust a heat generated within an electronic device.

Additionally, according to embodiments of the present invention, when substrates are piled up, it is possible to prevent a heat from being transferred from a lower substrate to an upper substrate or other substrates.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
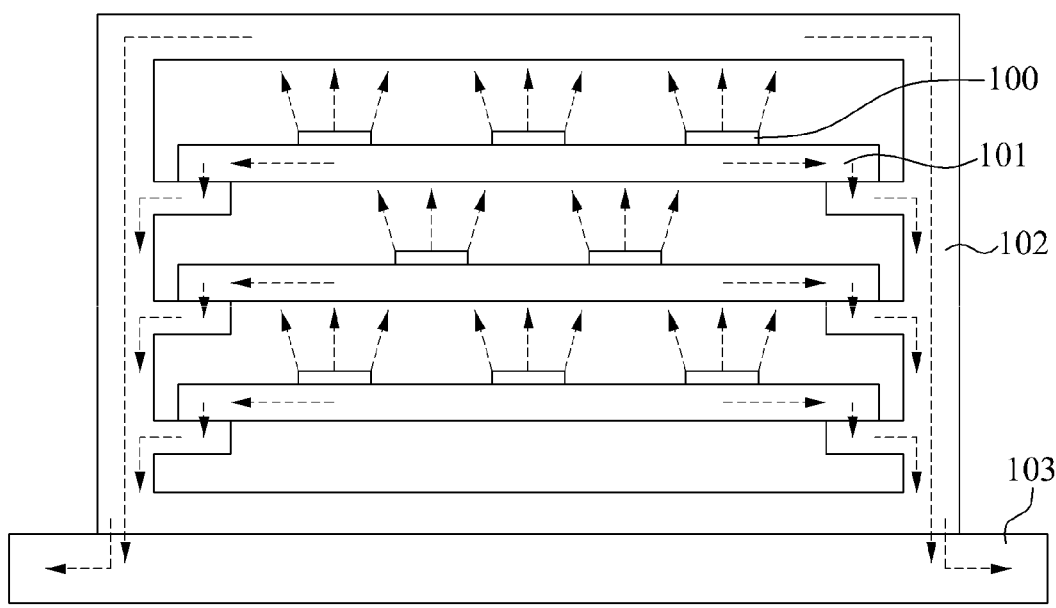
FIGS. 1 and 2 are diagrams illustrating conventional heat exhaustion structures.
Figure 2:
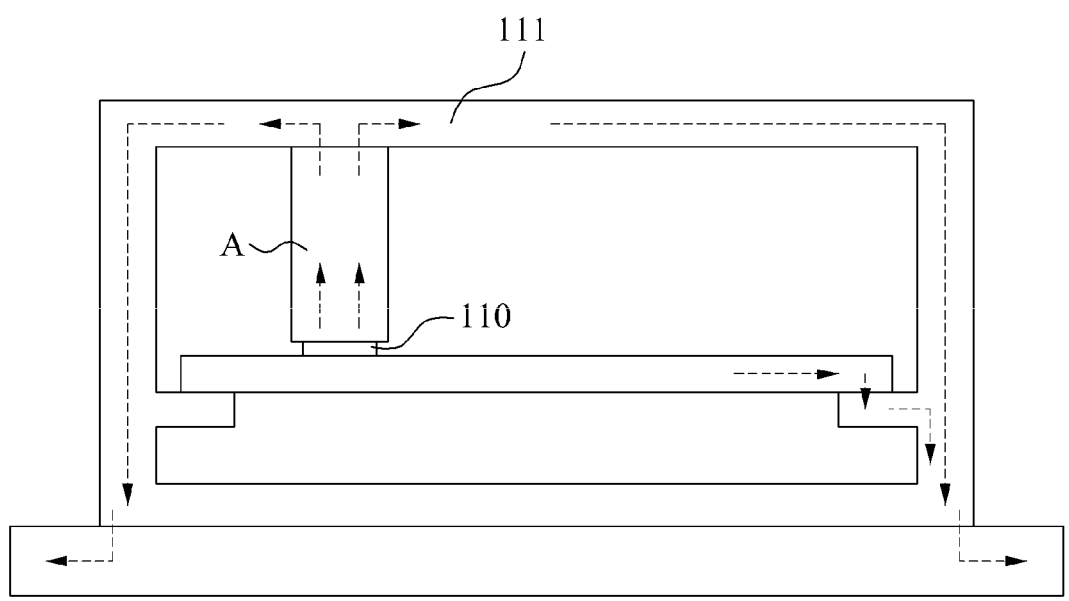

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Figure 3:
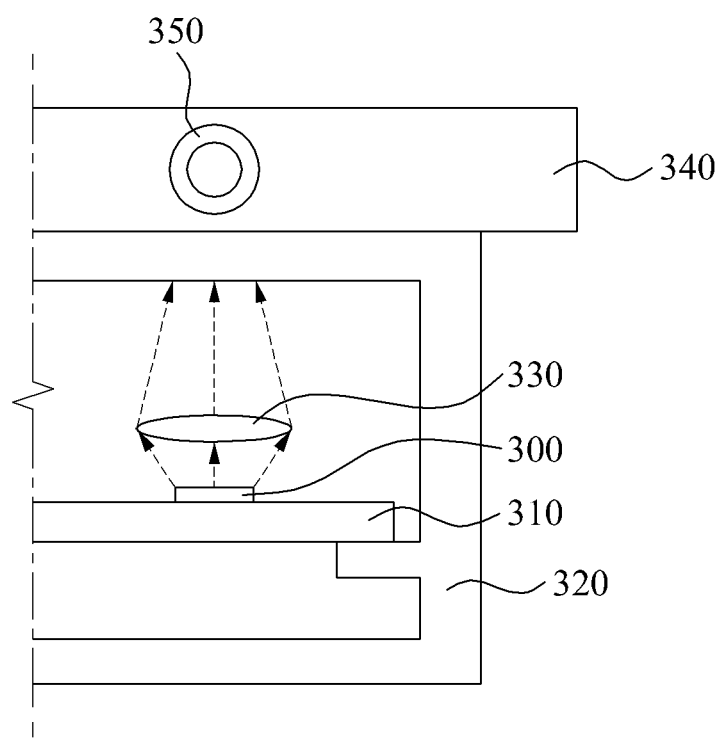
FIG. 3 is a diagram illustrating a heat exhaustion structure for a heat dissipating device according to an embodiment of the present invention.

FIG. 3 is a diagram illustrating a heat exhaustion structure for a heat dissipating device according to an embodiment of the present invention.

Referring to FIG. 3, the heat exhaustion structure may include a heat dissipating device 300, a Printed Circuit Board (substrate) 310, a case 320, and an infrared lens 330.

The heat dissipating device 300 may be installed on a side of the substrate 310, and may be implemented as various types of electronic devices and components, for example, a condenser, a semiconductor device, a sensor, a transistor, an amplifier, a diode, and the like.

The substrate 310 where the heat dissipating device 300 is installed may provide a connection of the installed heat dissipating device 300 using a conductive line or a signal line.

The case 320 may be installed on the other side of the substrate 310. When a heat generated by the heat dissipating device 300 is transferred to the case 320, the case 320 may transfer the heat to a heat sink 340, or the outside. The case 320 may be made of metal materials or plastic materials, on demand.

The infrared lens 330 may be disposed on a route where the heat generated by the heat dissipating device 300 is radiated, and may deflect the heat to the heat sink 340 and to the case 320.

The heat sink 340 may absorb a heat transferred from the infrared lens 340 or from the case 320, and may dissipate the absorbed heat to the outside.

In other words, the heat generated by the heat dissipating device 300 may be deflected by the infrared lens 330 and thus, it is possible to more concentratively transfer the heat to the heat sink 340 and the case 320.

In particular, at least one heat pipe 350 may be installed inside or outside the heat sink 340. The heat pipe 350 may be used to efficiently transfer a heat, and may be implemented, for example, as a metal pipe using a refrigerant that generally has a high thermal conductive coefficient.

As a result, the infrared lens 330 may deflect the heat generated by the heat dissipating device 300, so that the heat may be concentratively transferred to a predetermined portion of the heat sink 340 where the heat pipe 350 is installed, thereby increasing a heat exhaust effect.

Figure 4:
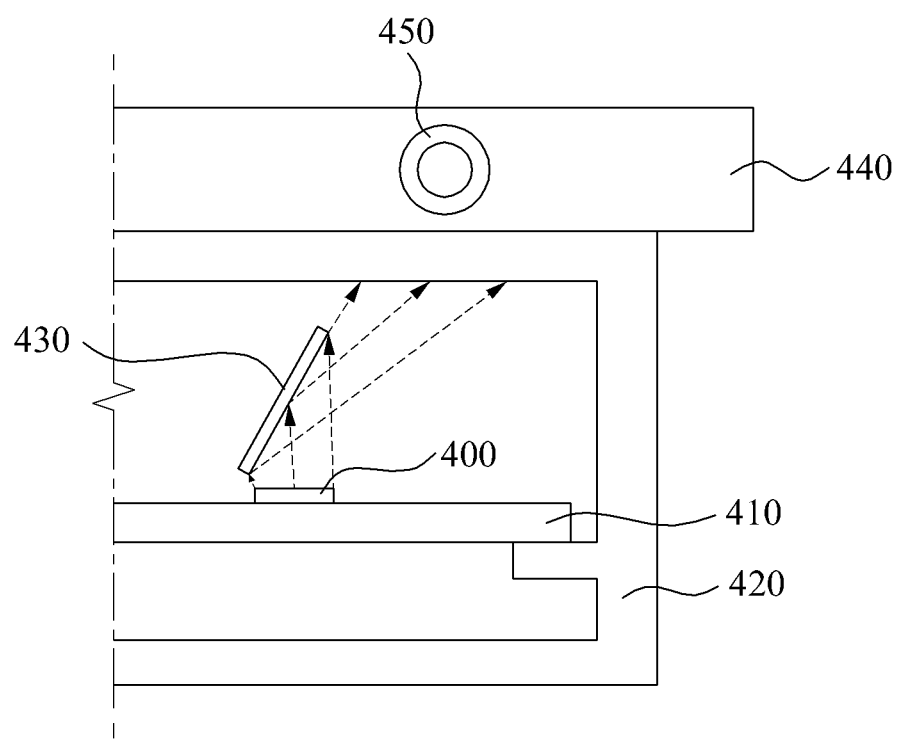
FIG. 4 is a diagram illustrating a heat exhaustion structure for a heat dissipating device according to another embodiment of the present invention.

FIG. 4 is a diagram illustrating a heat exhaustion structure for a heat dissipating device according to another embodiment of the present invention.

In the heat exhaustion structure of FIG. 4, an infrared reflecting mirror 430 may be installed, instead of the infrared lens 330 of FIG. 3. Additionally, a heat dissipating device 400, a substrate 410, a case 420, a heat sink 440, and a heat pipe 450 of FIG. 4 may be respectively identical to the heat dissipating device 300, the substrate 310, the case 320, the heat sink 340, and the heat pipe 350 of FIG. 3.

Referring to FIG. 4, the infrared reflecting mirror 430 may be disposed on a route where a heat is reflected from the heat dissipating device 400, and may reflect the heat to the heat sink 440 or the case 420.

When the heat pipe 450 is installed inside and outside the heat sink 440, the embodiment may be further utilized, since the heat may be more accurately reflected in a direction that the heat pipe 450 is installed by adjusting an installation angle of the infrared reflection mirror 430. The infrared reflecting mirror 430 may desirably be disposed on the route where the heat is radiated from the heat dissipating device 400, at an angle where the radiated heat is concentratively reflected to a predetermined portion of the heat sink 440 where the heat pipe 450 is installed.

Figure 5:
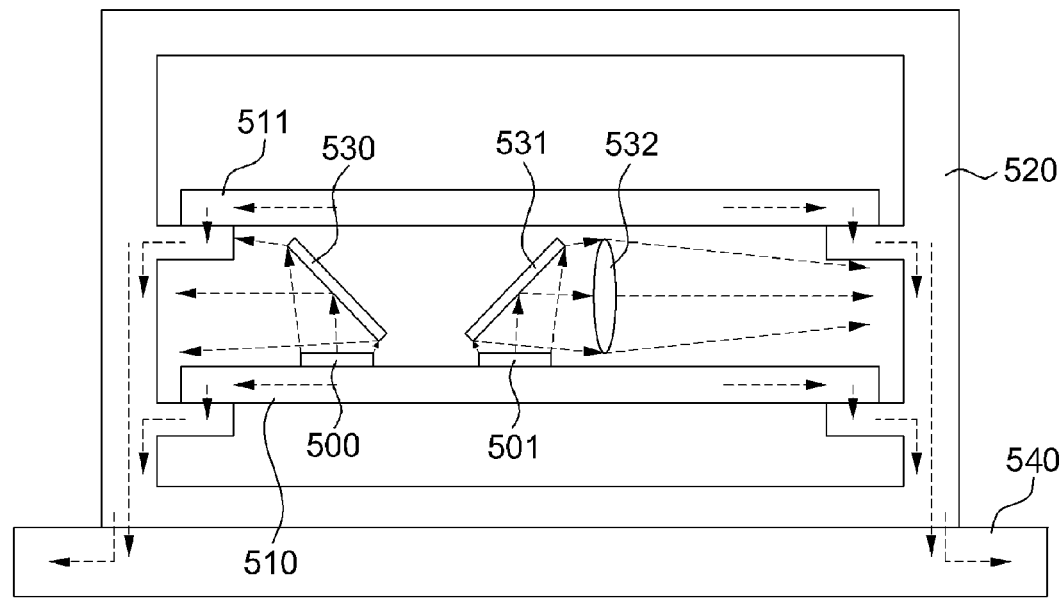
FIG. 5 is a diagram illustrating a heat exhaustion structure for a heat dissipating device according to still another embodiment of the present invention.

FIG. 5 is a diagram illustrating a heat exhaustion structure for a heat dissipating device according to still another embodiment of the present invention.

The heat exhaustion structure of FIG. 5 may include heat dissipating devices 500 and 501, substrates 510 and 511, a case 520, infrared reflecting mirrors 530 and 531, an infrared lens 532, and a heat sink 540 that may be identical to those included in the heat exhaustion structures of FIGS. 3 and 4. Additionally, in the heat exhaustion structure of FIG. 5, the substrates 510 and 511 are piled up.

In the case of the heat dissipating device 500, the infrared reflecting mirror 530 may be disposed on a route where a heat is radiated from the heat dissipating device 500. The infrared reflecting mirror 530 may reflect the radiated heat toward the case 520.

Accordingly, the heat generated by the heat dissipating device 500 may be transferred to the heat sink 540 through the case 520, rather than being radiated to the substrate 511 disposed above the substrate 510 where the heat dissipating device 500 is installed.

In the case of the heat dissipating device 501, the infrared reflecting mirror 531 and the infrared lens 532 may be disposed on a route where a heat is radiated from the heat dissipating device 501. The infrared reflecting minor 531 may reflect the radiated heat toward the case 520, and the infrared lens 532 may deflect the heat reflected by the infrared reflecting mirror 531 to the case 520 so that the heat may be concentrated on the case 520.

As a result, the heat radiated from the heat dissipating device 501 may be transferred to the case 520 through the deflecting operation, as well as the reflecting operation, and thus a heat loss may be reduced compared to the heat dissipating device 500.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A heat exhaustion structure for a heat dissipating device, the heat exhaustion structure comprising:
   a substrate where the heat dissipating device is installed;
   a case to transfer a heat generated by the heat dissipating device to a heat sink or to an outside, the case being installed in a side of the substrate; and an infrared reflecting mirror to reflect the heat to the heat sink or to the case.

2. The heat exhaustion structure of claim 1, wherein the infrared reflecting mirror is disposed on a route where the generated heat is radiated.

3. The heat exhaustion structure of claim 1, wherein the infrared reflecting mirror is disposed on a route where the generated heat is radiated, at an angle where the radiated heat is concentratively reflected to a predetermined portion of the heat sink or to a predetermined portion of the case.

4. The heat exhaustion structure of claim 1, wherein the heat sink comprises a heat pipe mounted inside or outside the heat sink, and
    wherein the infrared reflecting minor is disposed on a route where the generated heat is radiated, at an angle where the radiated heat is concentratively reflected to a portion of the heat sink where the heat pipe is mounted.

\* \* \* \* \*